(12) United States Patent
Amamiya et al.

(10) Patent No.: US 10,030,085 B2
(45) Date of Patent: Jul. 24, 2018

(54) RESIN COMPOSITION FOR SOLAR CELL ENCAPSULANT, AND SOLAR CELL ENCAPSULANT AND SOLAR CELL MODULE USING THE SAME

(75) Inventors: Takahiro Amamiya, Koto-ku (JP); Tamami Onaka, Tanabe (JP)

(73) Assignee: Japan Polyethylene Corporation, Tokyo (JP)

( * ) Notice: Subject to any disclaimer, the term of this patent is extended or adjusted under 35 U.S.C. 154(b) by 850 days.

(21) Appl. No.: 13/805,487

(22) PCT Filed: Jun. 23, 2011

(86) PCT No.: PCT/JP2011/064358
§ 371 (c)(1),
(2), (4) Date: Feb. 14, 2013

(87) PCT Pub. No.: WO2011/162324
PCT Pub. Date: Dec. 29, 2011

(65) Prior Publication Data
US 2013/0137833 A1 May 30, 2013

(30) Foreign Application Priority Data

Jun. 25, 2010 (JP) .................................. 2010-144918
Jun. 25, 2010 (JP) .................................. 2010-145265

(51) Int. Cl.
*C08F 210/16* (2006.01)
*C08K 5/14* (2006.01)
(Continued)

(52) U.S. Cl.
CPC .............. *C08F 210/16* (2013.01); *C08K 5/14* (2013.01); *C08K 5/3435* (2013.01);
(Continued)

(58) Field of Classification Search
USPC ....................................................... 525/333.7
See application file for complete search history.

(56) References Cited

U.S. PATENT DOCUMENTS 5,015,521 A * 5/1991 Fujii ..................... B29C 55/005
428/220
2007/0036970 A1 * 2/2007 Stumphauzer et al. ...... 428/355 EN
(Continued)

FOREIGN PATENT DOCUMENTS

JP       9 116182      5/1997
JP      2003 204073      7/2003
(Continued)

OTHER PUBLICATIONS

Extended European Search Report dated Nov. 27, 2013 in European Patent Application No. 11798205.8.
(Continued)

*Primary Examiner* — Ling Siu Choi
*Assistant Examiner* — Thuy-Ai N Nguyen
(74) *Attorney, Agent, or Firm* — Oblon, McClelland, Maier & Neustadt, L.L.P.

(57) ABSTRACT

A resin composition for a solar cell encapsulant containing an ethylene.α-olefin copolymer and an organic peroxide or a silane coupling agent or the like, and having superior heat resistance, transparency, flexibility and adhesion property to a glass substrate, as well as good balance between rigidity and cross-linking efficiency, the solar cell encapsulant and a solar cell module using the same.
It is provided by a resin composition for the solar cell encapsulant characterized by containing the ethylene.α-olefin copolymer (A) having the characteristics of the following (a1) to (a5), and the organic peroxide (B) and/or the silane coupling agent (C).
(a1) a density of 0.860 to 0.920 g/cm³
(Continued)

(a2) a ratio, (Mz/Mn), of Z average molecular weight (Mz) and number average molecular weight (Mn) determined by a gel permeation chromatography (GPC), of 8.0 or less (a3) a melt viscosity ($\eta^*_1$) measured at 100° C. under a shear rate of $2.43 \times 10 \ s^{-1}$ of $1.2 \times 10^5$ poise or more (a4) a melt viscosity ($\eta^*_2$) measured at 100° C. under a shear rate of $2.43 \times 10^2 \ s^{-1}$ of $2.0 \times 10^4$ poise or more (a5) a branch number (N) derived from a comonomer in a polymer satisfying the expression (a).

22 Claims, 1 Drawing Sheet

(51) Int. Cl.
    *C08K 5/5425*     (2006.01)
    *H01L 31/048*     (2014.01)
    *C08K 5/3435*     (2006.01)
    *C09K 3/10*     (2006.01)
    *C08K 5/132*     (2006.01)

(52) U.S. Cl.
    CPC .............. *C08K 5/5425* (2013.01); *C09K 3/10* (2013.01); *H01L 31/0481* (2013.01); *C08K 5/132* (2013.01); *C09K 2200/062* (2013.01); *C09K 2200/0617* (2013.01); *Y02E 10/50* (2013.01)

(56) References Cited

U.S. PATENT DOCUMENTS

| | | |
|---|---|---|
| 2007/0082185 A1 | 4/2007 | Ikeno et al. |
| 2007/0082187 A1* | 4/2007 | Wang et al. ............... 428/292.1 |
| 2007/0251572 A1* | 11/2007 | Hoya .................. C08L 23/0815 136/256 |
| 2008/0078445 A1 | 4/2008 | Patel et al. |
| 2008/0108757 A1 | 5/2008 | Hoya et al. |
| 2010/0000600 A1 | 1/2010 | Hoya |
| 2012/0000514 A1 | 1/2012 | Amamiya et al. |

FOREIGN PATENT DOCUMENTS

| | | |
|---|---|---|
| JP | 2006 210906 | 8/2006 |
| JP | 2007 103738 | 4/2007 |
| WO | 2007 119767 | 10/2007 |
| WO | 2008 0015984 | 2/2008 |
| WO | 2008 036708 | 3/2008 |
| WO | 2009 069742 | 6/2009 |

OTHER PUBLICATIONS

International Search Report dated Aug. 2, 2011 in PCT/JP11/64358 filed Jun. 23, 2011.
U.S. Appl. No. 13/806,485, filed Dec. 21, 2012, Amamiya, et al.

\* cited by examiner

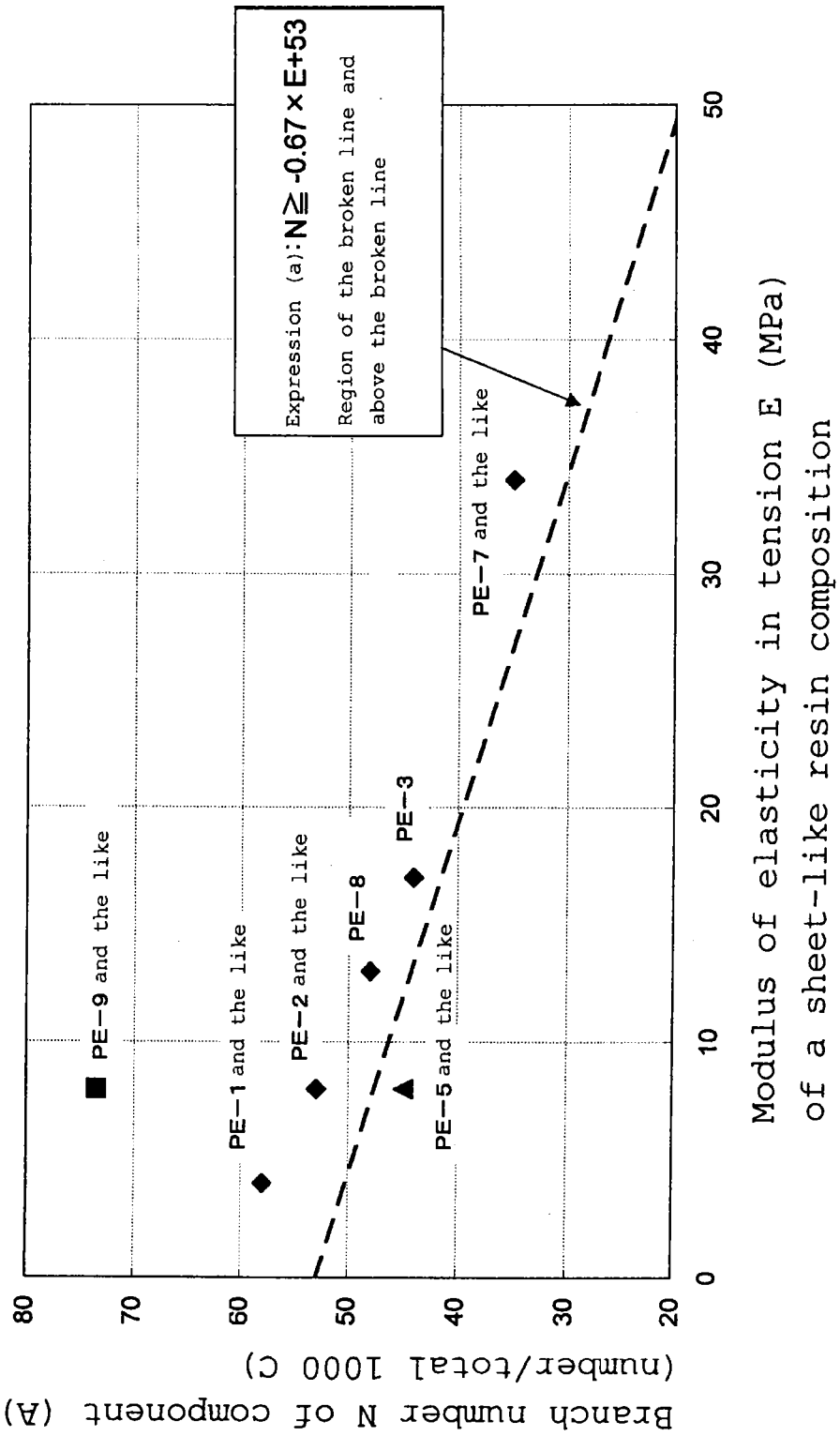

RESIN COMPOSITION FOR SOLAR CELL ENCAPSULANT, AND SOLAR CELL ENCAPSULANT AND SOLAR CELL MODULE USING THE SAME

TECHNICAL FIELD

The present invention relates to a resin composition for a solar cell encapsulant, a solar cell encapsulant and a solar cell module using the same, and in more detail, the present invention relates to the resin composition for the solar cell encapsulant containing an ethylene.α-olefin copolymer and an organic peroxide or a silane coupling agent or the like, and having superior heat resistance, transparency, flexibility and adhesion property to a glass substrate, as well as good balance between rigidity and cross-linking efficiency, and the solar cell encapsulant and the solar cell module using the same.

BACKGROUND ART

In the midst of close-up of a global environmental problem such as increase in carbon dioxide, photovoltaic power generation has been drawn attention again, as well as effective utilization of hydraulic power, wind power, geothermal heat or the like.

The photovoltaic power generation is the one using a packaged solar cell module, obtained in general by protecting a solar cell element of silicon, gallium-arsenic, copper-indium-selenium or the like with an upper transparent protecting material and a lower substrate protecting material, and fixing the solar cell element and the protecting material with an encapsulant made of a resin, and since it can be arranged in a decentralized state at a place where electric power is necessary, although scale thereof is smaller as compared with hydraulic power, wind-power or the like, research and development has been promoted aiming at performance enhancement of power generation efficiency or the like, and price reduction. In addition, by adoption of a policy to subsidize the installment cost, as an introduction promotion business of a residential house photovoltaic power generation system by state or local governments, prevalence thereof has gradually been progressing. However, still more cost reduction is required for further prevalence thereof, and accordingly, effort has been continued in a step-by-step fashion not only to develop a solar cell element using a novel material instead of conventional-type silicon or gallium-arsenic, but also to further reduce production cost of the solar cell module.

As requisite of the solar cell encapsulant composing the solar cell module, good transparency has been required, so as not to decrease power generation efficiency of the solar cell, and to secure incidence amount of sunlight. In addition, the solar cell module is usually installed outdoors, which raises temperature caused by exposure to sunlight for a long period of time. To avoid such a trouble as deformation of the module by flowing of the encapsulant made of a resin, caused by increase in temperature, it should be the one having heat resistance. In addition, thinning trend has been progressing year by year, to reduce material cost of the solar cell element, and the encapsulant superior in still more flexibility has also been required.

At present, as the encapsulant of the solar cell element in the solar cell module, in view of flexibility, transparency or the like, an ethylene.vinyl acetate copolymer, having high content of vinyl acetate, has been adopted as a resin component, where the organic peroxide is used in combination, as a cross-linking agent (for example, see PATENT LITERATURE 1).

And, in an encapsulation work of the solar cell element, the solar cell element is covered with the encapsulant made of a resin, then it is heated for several minutes to ten and several minutes for tentative adhesion, and is heat-treated at high temperature, where the organic peroxide decomposes in an oven, for several minutes to 1 hour for adhesion (for example, see PATENT LITERATURE 2).

However, to suppress production cost of the solar cell module, it has been required to further shorten time required in the encapsulation work, and the solar cell encapsulant has been proposed, which is composed of an α-olefin copolymer which is amorphous or low crystalline with a crystallinity of 40% or less, instead of the ethylene.vinyl acetate copolymer, as a resin component of the encapsulant (see PATENT LITERATURE 3). In this PATENT LITERATURE 3, there has been exemplified the production of a sheet at a processing temperature of 100° C., using a profile extruder, by mixing the organic peroxide to an amorphous or low crystalline ethylene.butene copolymer, however, because of low processing temperature, sufficient productivity has not been obtained.

There was also the case in the solar cell module, where the module may deform, by temperature increase caused by exposure to sunlight for a long period of time, due to installment outdoors as above-described, followed by resultant decrease in adhesion strength between a glass substrate and the encapsulant made of a resin, separation of the encapsulant made of a resin from the glass substrate, and intrusion of air or moisture into space therebetween. The PATENT LITERATURE 1 has described to blend the silane coupling agent to an encapsulating resin, however, it relates to the solar cell module using a flexible substrate such as a fluorocarbon resin film, and has not clarified detail of the silane coupling agent. The above PATENT LITERATURE 2 has also described to blend the silane coupling agent to the encapsulating resin, however, it relates to the solar cell module using an EVA film and an FRP substrate, and adhesion property with the substrate is not sufficient.

In addition, as the encapsulant of the solar cell module, there has been proposed a polymer material containing an polyolefin copolymer which satisfies one or more requisites among (a) a density of less than about 0.90 g/cc, (b) a 2% secant modulus of less than about 150 megapascal (mPa), measured in accordance with ASTM D-882-02, (c) a melting point of lower than about 95° C., (d) an α-olefin content of about 15% to 50% by weight based on weight of a polymer, (e) a Tg of lower than about −35° C. and (f) an SCBDI of at least about 50 (see PATENT LITERATURE 4).

In the solar cell module, there is tendency for also the solar cell encapsulant to become thinner accompanying with thinning of the solar cell element. In this case, it has been a problem of easy break of a wiring caused when impact is applied thereto from the upper protecting material side or the lower protecting material side of the solar cell encapsulant. In order to improve this problem, it is required to increase the rigidity of the encapsulant, however, the polymer material of PATENT LITERATURE 4 had a problem to deteriorate the cross-linking efficiency, when increased the rigidity.

As just described, the conventional technology has not provided the resin composition for the solar cell encapsulant with superior productivity, heat resistance, transparency, flexibility and adhesive property to the glass substrate.

CITATION LIST

Patent Literature

PATENT LITERATURE 1: JP-A-9-116182
PATENT LITERATURE 2: JP-A-2003-204073
PATENT LITERATURE 3: JP-A-2006-210906
PATENT LITERATURE 4: JP-A-2010-504647

SUMMARY OF INVENTION

Technical Problem

It is an object of the present invention to provide the resin composition for the solar cell encapsulant containing the ethylene.α-olefin copolymer and the organic peroxide or the silane coupling agent or the like, and having superior heat resistance, transparency, flexibility, and the solar cell encapsulant and the solar cell module using the same.

Solution to Problem

The present inventors have intensively studied a way to solve the above-described problems and obtained the knowledge that the solar cell encapsulant having superior heat resistance, transparency, flexibility, can be obtained by selecting the ethylene.α-olefin copolymer, which is polymerized using a metallocene catalyst and the like and has specified density, molecular weight distribution and melt viscosity characteristics, as a resin component, and by using the resin component blended with the organic peroxide or the silane coupling agent into this polymer, and productivity of the solar cell module can be enhanced significantly by using this, and have thus completed the present invention.

That is, according to the first aspect of the present invention, there is provided a resin composition for the solar cell encapsulant characterized by comprising the following component (A) and component (B).

Component (A); an ethylene.α-olefin copolymer having characteristics of the following (a1) to (a5)
(a1) a density of 0.860 to 0.920 g/cm$^3$
(a2) a ratio, (Mz/Mn), of Z average molecular weight (Mz) and number average molecular weight (Mn) determined by a gel permeation chromatography (GPC), of 8.0 or less
(a3) a melt viscosity ($\eta^*_1$) measured at 100° C. under a shear rate of 2.43×10 s$^{-1}$ of 1.2×10$^5$ poise or more
(a4) a melt viscosity ($\eta^*_2$) measured at 100° C. under a shear rate of 2.43×10$^2$ s$^{-1}$ of 2.0×10$^4$ poise or more
(a5) a branch number (N) derived from a comonomer in a polymer satisfies the following expression (a).

$$N \geq -0.67 \times E + 53 \qquad \text{Expression (a)}$$

(wherein N represents the branch number per total 1000 carbon atoms in a main chain and a side chain, measured by NMR; and E represents a modulus of elasticity in tension of a sheet, measured in accordance with ISO1184-1983)

Component (B); a silane coupling agent

In addition, according to the second aspect of the present invention, there is provided the resin composition for the solar cell encapsulant characterized in that, in the first aspect, (a5) the branch number (N) derived from a comonomer in a polymer satisfies the following expression (a').

$$-0.67 \times E + 80 \geq N \geq -0.67 \times E + 53 \qquad \text{Expression (a')}$$

(wherein N represents the branch number per total 1000 carbon atoms in a main chain and a side chain, measured by NMR; and E represents a modulus of elasticity in tension of a sheet, measured in accordance with ISO1184-1983).

In addition, according to the third aspect of the present invention, there is provided a resin composition for the solar cell encapsulant characterized by comprising the following component (A) and component (B).

Component (A); an ethylene.α-olefin copolymer having characteristics of the following (a1) to (a4) and (a6):
(a1) a density of 0.860 to 0.920 g/cm$^3$
(a2) a ratio, (Mz/Mn), of Z average molecular weight (Mz) and number average molecular weight (Mn) determined by a gel permeation chromatography (GPC), of 8.0 or less
(a3) a melt viscosity ($\eta^*_1$) measured at 100° C. under a shear rate of 2.43×10 s$^{-1}$ of 1.2×10$^5$ poise or less
(a4) a melt viscosity ($\eta^*_2$) measured at 100° C. under a shear rate of 2.43×10$^2$ s$^{-1}$ of 2.0×10$^4$ poise or less
(a6) a flow ratio (FR): a ratio ($I_{10}/I_{2.16}$) of $I_{10}$ which is an MFR measured value at 190° C. under a load of 10 kg, and $I_{2.16}$ which is an MFR measured value at 190° C. under a load of 2.16 kg, of below 7.0

Component (B); a silane coupling agent

In addition, according to the fourth aspect of the present invention, there is provided the resin composition for the solar cell encapsulant characterized in that, in the third aspect, the flow ratio (FR) of characteristics (a6) is 5.0 to 6.2.

In addition, according to the fifth aspect of the present invention, there is provided the resin composition for the solar cell encapsulant characterized in that, in any of the first to the fourth aspects, the content of the component (B) is 0.01 to 5 parts by weight, relative to 100 parts by weight of the component (A).

In addition, according to the sixth aspect of the present invention, there is provided the resin composition for the solar cell encapsulant characterized by, in any of the first to the fifth aspects, comprising the following component (C) in an amount of 0.2 to 5 parts by weight, relative to 100 parts by weight of the component (A).

Component (C); an organic peroxide

In addition, according to the seventh aspect of the present invention, there is provided the resin composition for the solar cell encapsulant according to claims 1 to 3 characterized by, in any of the first to the sixth aspects, comprising the following component (D) in an amount of 0.01 to 2.5 parts by weight, relative to 100 parts by weight of the component (A):

Component (D): a hindered amine-type light stabilizer.

In addition, according to the eighth aspect of the present invention, there is provided the resin composition for the solar cell encapsulant characterized in that, in the first to the seventh aspects, the component (A) is an ethylene.1-butene copolymer or an ethylene.1-hexene copolymer.

Advantageous Effects of Invention

Because the resin composition for the solar cell encapsulant of the present invention has the ethylene.α-olefin copolymer having specified density, molecular weight distribution and melt viscosity characteristics, as a main component, blending of the silane coupling agent thereto provides good adhesion property to a glass substrate, and also because of blending of the organic peroxide provides, in sheet-forming this resin composition, the ethylene.α-olefin copolymer has sufficient adhesive strength by cross-linking in a relatively short period of time, good balance between rigidity and cross-linking efficiency, easy formation of a module as the solar cell encapsulant, and is capable of reducing production cost. In addition, good calendering property thereof enhances productivity. In addition, the obtained solar cell module is superior in transparency, flexibility, weather resistance or the like, and is expected to maintain stable conversion efficiency for a long period of time.

BRIEF DESCRIPTION OF DRAWINGS

FIG. 1 is a graph showing a range of the expression (a) specifying relation between the branch number of the component (A) in the resin composition and the modulus of elasticity in tension of a sheet-like resin composition.

DESCRIPTION OF EMBODIMENTS

1. Resin Composition for the Solar Cell Encapsulant

The resin composition for the solar cell encapsulant (hereinafter may be referred to simply as the resin composition) of the present invention contains the following ethylene.α-olefin copolymer (A) and the organic peroxide (B) and/or the silane coupling agent (C).

(1) Component (A)

The component (A) to be used in the present invention is the ethylene.α-olefin copolymer having characteristics of the following (a1) to (a4), and still more preferably the ethylene.α-olefin copolymer having characteristics of (a5) and/or (a6).

(a1) a density of 0.860 to 0.920 g/cm$^3$ (a2) a ratio, (Mz/Mn), of Z average molecular weight (Mz) and number average molecular weight (Mn) determined by a gel permeation chromatography (GPC), of 8.0 or less (a3) a melt viscosity ($\eta^*_1$) measured at 100° C. under a shear rate of 2.43×10 s$^{-1}$ of 1.2×10$^5$ poise or more (a4) a melt viscosity ($\eta^*_2$) measured at 100° C. under a shear rate of 2.43×10$^2$ s$^{-1}$ of 2.0×10$^4$ poise or more.

(a5) a branch number (N) derived from a comonomer in a polymer satisfies the following expression (a).

$$N \geq -0.67 \times E + 53 \quad \text{Expression (a)}$$

(wherein N represents the branch number per total 1000 carbon atoms in a main chain and a side chain, measured by NMR; and E represents modulus of elasticity in tension of a sheet, measured in accordance with ISO1184-1983)

(a6) a flow ratio (FR): a ratio (I$_{10}$/I$_{2.16}$) of I$_{10}$ which is an MFR measured value at 190° C. under a load of 10 kg, and I$_{2.16}$ which is an MFR measured value at 190° C. under a load of 2.16 kg, of below 7.0.

(i) Monomer Composition of Component (A)

The ethylene.α-olefin copolymer to be used in the present invention is a random copolymer of ethylene and an α-olefin, where a composition unit derived from ethylene is a main component.

The α-olefin to be used as the comonomer is the α-olefin having carbon atoms of preferably 3 to 12. Specifically, it includes propylene, 1-1-butene-pentene, 1-1-hexene-octene, 1-heptene, 4-methyl-pentene-1,4-methyl-1-hexene, 4,4-dimethyl-pentene-1 or the like. A specific example of such the ethylene.α-olefin copolymer includes an ethylene.propylene copolymer, an ethylene.1-butene copolymer, an ethylene.1-hexene copolymer, an ethylene.1-octene copolymer, an ethylene.4-methyl-pentene-1 copolymer or the like. Among these, the ethylene.1-butene copolymer and the ethylene.1-hexene copolymer are preferable. In addition, the α-olefin may be one kind or two or more kinds in combination. In the case of a terpolymer obtained by combining two kinds of α-olefins, it includes an ethylene.propylene.1-hexene terpolymer, an ethylene.1-butene.1-hexene terpolymer, an ethylene.propylene.1-octene terpolymer, an ethylene.1-butene.1-octene terpolymer or the like.

As the comonomer, a diene compound such as 1,5-hexadiene, 1,6-heptadiene, 1,7-octadiene, 1,8-nonadiene, and 1,9-decadiene may be blended in small amount to the α-olefin. Blending of these diene compounds provides long-chain branches, which decreases crystallinity and enhances transparency, flexibility, adhesive property or the like of the ethylene.α-olefin copolymer, as well as increases mechanical strength, because they also work as an inter-polymer cross-linking agent. In addition, because a terminal group of the long-chain branch is an unsaturated group, it is capable of easily generating a cross-linking reaction by the organic peroxide, or a copolymerization reaction or a graft reaction with an acid anhydride group-containing compound or an epoxy group-containing compound.

Content of the α-olefin of the ethylene.α-olefin copolymer to be used in the present invention is 5 to 40% by weight, preferably 10 to 35% by weight, and more preferably 15 to 30% by weight. The content within this range provides good flexibility and heat resistance.

The content of the α-olefin here is a value measured by a 13C-NMR method under the following conditions:
 Apparatus: JEOL-GSX270, manufactured by JOEL Ltd.
 Concentration: 300 mg/2 mL
 Solvent: Ortho-dichlorobenzene (ii) Polymerization Catalyst and Polymerization Method for Component (A)

The ethylene.α-olefin copolymer to be used in the present invention can be produced using a Ziegler catalyst, a vanadium catalyst or a metallocene catalyst or the like, preferably the vanadium catalyst or the metallocene catalyst, and more preferably the metallocene catalyst. A production method includes a high pressure ionic polymerization method, a vapor-phase method, a solution method, a slurry method, or the like.

The metallocene catalyst is not especially limited, however, such a catalyst is included that a metallocene compound such as a zirconium compound coordinated with a group or the like having a cyclopentadienyl skeleton, and a promoter are used as catalyst components. Commercial products include HARMOREX (registered trademark) series and Kernel (registered trademark) series, produced by Japan Polyethylene Corp.; Evolue (registered trademark) series, produced by Prime Polymer Co., Ltd; Excellen (registered trademark) GMH series, and Excellen (registered trademark) FX series, produced by Sumitomo Chemical Co., Ltd. As the vanadium catalyst, a catalyst having a soluble vanadium compound and an organoaluminum halide as catalyst components are included.

(iii) Characteristics of Component (A)

(a1) Density

The ethylene.α-olefin copolymer to be used in the present invention has a density of preferably 0.860 to 0.920 g/cm$^3$, more preferably 0.870 to 0.915 g/cm$^3$, and still more preferably 0.875 to 0.910 g/cm$^3$. The density of the ethylene.α-olefin copolymer below 0.860 g/cm$^3$ results in blocking of a sheet after processing, while the density over 0.920 g/cm$^3$ provides too high rigidity of the sheet after processing, giving difficult handling.

In order to adjust polymer density, a method is taken for adjusting, as appropriate, for example, content of the α-olefin, polymerization temperature, catalyst amount or the like. It should be noted that the density of the ethylene.α-olefin copolymer is measured in accordance with JIS-K6922-2: 1997 attachment (the case of a low density polyethylene) (23° C.).

(a2) Ratio (Mz/Mn) of Z Average Molecular Weight (Mz) and Number Average Molecular Weight (Mn).

The ethylene.α-olefin copolymer to be used in the present invention has the ratio (Mz/Mn) of Z average molecular weight (Mz) and number average molecular weight (Mn), determined by a gel permeation chromatography (GPC), of 8.0 or less, preferably 5.0 or less, and more preferably 4.0 or less. In addition, Mz/Mn is 2.0 or more, preferably 2.5 or more, and more preferably 3.0 or more. However, the Mz/Mn over 8.0 deteriorates transparency. Adjusting of Mz/Mn within a predetermined range may be performed by a method for selecting a suitable catalyst system or the like.

It should be noted that measurement of Mz/Mn is performed by the gel permeation chromatography (GPC) under the following conditions:

Apparatus: GPC 150C model, manufactured by Waters Co., Ltd.

Detector: 1A infrared spectrophotometer (a measurement wavelength of 3.42 μm), manufactured by MIRAN Co., Ltd.

Column: Three sets of AD806M/S, manufactured by Showa Denko K.K. (Calibration of the column was performed by measurement of single dispersion polystyrene, produced by Tosoh Corp. (a 0.5 mg/ml solution of each of A500, A2500, F1, F2, F4, F10, F20, F40, and F288), and approximated logarithmic values of eluted volume and molecular weight with a quadratic expression. In addition, molecular weight of the sample was converted to that of polyethylene using viscosity equation of polystyrene and polyethylene. Here, coefficients of the viscosity equation of polystyrene are α=0.723 and log K=−3.967, while those for polyethylene are α=0.733 and log K=−3.407.)

Measurement temperature: 140° C.
Concentration: 20 mg/10 mL
Injection volume: 0.2 mL
Solvent: Ortho-dichlorobenzene
Flow rate: 1.0 ml/minute It should be noted that because the Z average molecular weight (Mz) has large contribution to average molecular weight of a high molecular weight component, Mz/Mn provides easy confirmation of presence of the high molecular weight component, as compared with Mw/Mn. The high molecular weight component is a factor influencing on transparency, and increase in the high molecular weight component, consequently, deteriorates transparency. In addition, tendency of deterioration of cross-linking efficiency is also observed. Smaller Mz/Mn, therefore, is preferable.

(a3), (a4) Melt Viscosity

The ethylene.α-olefin copolymer to be used in the present invention should have shear rate, measured at 100° C., in a specified range. Reason for focusing on shear rate measured at 100° C. is because of estimating influence on a product in converting a composition at the relevant temperature to the product.

That is, the melt viscosity ($\eta^*_1$), under the shear rate of $2.43\times10$ $sec^{-1}$, is $1.2\times10^5$ poise or more, preferably $1.3\times10^5$ poise or more, more preferably $1.4\times10^5$ poise or more, further preferably $1.5\times10^5$ poise or more, further more preferably $1.6\times10^5$ poise or more. It is preferable that the melt viscosity ($\eta^*_1$) is $9.0\times10^5$ poise or less and still more $5.0\times10^5$ poise or less. The melt viscosity ($\eta^*_1$) within this range provides good productivity in low speed forming at low temperature, and generates no problems in fabrication to a product.

The melt viscosity ($\eta^*_1$) is adjustable by melt flow rate (MFR) or molecular weight distribution of the ethylene.α-olefin copolymer. Decrease in the melt flow rate value tends to increase the melt viscosity ($\eta^*_1$). When other property such as molecular weight distribution is different, magnitude relation may be reversed, however, by setting MFR (JIS-K6922-2: 1997 attachment (at 190° C., under a load of 21.18 N)) at preferably 0.1 to 2.5 g/10 minutes, more preferably 0.5 to 2.3 g/10 minutes, and still more preferably 0.7 to 2.0 g/10 minutes, the melt viscosity ($\eta^*_1$) tends to be easily adjusted within a predetermined range.

Still more, the ethylene.α-olefin copolymer to be used in the present invention should have the melt viscosity ($\eta^*_2$) measured at 100° C., under the shear rate of $2.43\times10^2$ $sec^{-1}$, is $2.0\times10^4$ poise or more, preferably $2.1\times10^4$ poise or more, more preferably $2.2\times10^4$ poise or more, still more preferably $2.3\times10^4$ poise or more, and most preferably $2.4\times10^4$ poise or more. It is preferable that the melt viscosity ($\eta^*_2$) is $9.0\times10^4$ poise or less and still more $5.0\times10^4$ poise or less. The melt viscosity ($\eta^*_2$) within this range provides good productivity in low speed molding at low temperature, and generates no problems in processing to a product.

Here, the melt viscosity ($\eta^*_1$), ($\eta^*_2$) is a measured value obtained by using a capillary rheometer having a capillary with a diameter of 1.0 mm, and L/D=10.

Reason for setting two kinds of shear rates is for obtaining a similar product in each of the molding speed regions, with small influence on the product surface in low speed and high speed molding.

In addition, the ethylene.α-olefin copolymer to be used in the present invention has a ratio of $\eta^*_1$ and $n^*_2$, ($\eta^*_1/\eta^*_2$), of preferably 8.0 or less, more preferably 7.0 or less, still more preferably 6.8 or less, and particularly preferably 6.5 or less. The ratio of $\eta^*_1$ and $\eta^*_2$, ($\eta^*_1/\eta^*_2$) is preferably 1.5 or more, and more preferably 2.0 or more still more preferably 3.0 or more, and particularly preferably 4.0 or less. The ($\eta^*_1/\eta^*_2$) within the above range provides small influence on the sheet surface, in low speed molding and in high speed molding, and is thus preferable.

(a5) Branch Number (N) Derived from a Comonomer in a Polymer

In the ethylene.α-olefin copolymer to be used in the present invention, it is preferable that the branch number (N) and the tension elastic modulus (E) satisfy the following expression (a).

$$N \geq -0.67 \times E + 53 \qquad \text{Expression (a)}$$

(wherein N represents the branch number per total 1000 carbon atoms in a main chain and a side chain, measured by NMR; and E represents modulus of elasticity in tension of a sheet, measured in accordance with ISO1184-1983).

In the present description, the branch number (N) derived from a comonomer in a polymer can be calculated from a C-NMR spectrum, with reference to, for example, E. W. Hansen, R. Blom, and O. M. Bade, Polymer, Vol. 36, p. 4295 (1997).

Relation between the branch number of the component (A) in the resin composition and the modulus of elasticity in tension of a sheet-like resin composition is as shown by a graph in FIG. 1. A range of the expression (a) specified by the present invention is a region higher than the straight line. Inside of this range provides good balance between rigidity and cross-linking efficiency of the resin composition and is thus preferable to obtain the solar cell encapsulant of the present invention, while the region lower than this region makes difficult to obtain the solar cell encapsulant of the present invention, because of deterioration of this balance.

In the solar cell module, there is tendency of making a thinner film of the solar cell encapsulant as well, accompanying with making thinner film of the solar cell element. In the solar cell encapsulant made as the thinner film, because of easy break of a wiring when impact is applied thereto from the upper or the lower protecting material side, it is required to increase a rigidity of the encapsulant. Increase in the rigidity deteriorates cross-linking efficiency, therefore, it is necessary to use as a material with enhanced moldability, by using a copolymer with a certain high branch degree of a high polymer chain and thus enhancing fluidity of the copolymer before cross-linking. In the present invention, by selecting the one where the branch number (N) derived from the comonomer of the ethylene/α-olefin copolymer has a polymer structure satisfying the expression (a), balance between rigidity and cross-linking efficiency can be made good.

The ethylene.α-olefin copolymer relevant to the present invention can be produced by a copolymerization reaction using a catalyst, as described above, however, by selecting composition ratio of raw material monomers to be copolymerized, or kind of the catalyst, branch degree in the high polymer chain can easily be adjusted. For the ethylene.α-olefin copolymer to be used in the present invention to satisfy the expression (a), the comonomer in the ethylene.α-olefin copolymer is preferably selected from propylene, 1-butene or 1-hexene. In addition, it is preferable to produce it using a vapor phase method and a high pressure method, and in particular, it is more preferable to select the high pressure method.

More specifically, increasing or decreasing N by fixing E can be attained by a method for changing mainly number of carbon atoms of a comonomer to be copolymerized with ethylene. It is preferable to produce the ethylene.α-olefin copolymer by mixing 1-butene or 1-hexene so as to become an amount of 60 to 80% by weight, relative to ethylene, using a metallocene catalyst, and reacting them at a polymerization temperature of 130 to 200° C. In this way, the branch number N of the ethylene.α-olefin copolymer can be adjusted suitably, and the ethylene.α-olefin copolymer can be obtained, which has a modulus of elasticity in tension E of the obtained sheet of 40 MPa or less, and within a range shown by the expression (a).

In the present invention, a relational expression of characteristics (a5) is preferable to be shown by the following expression (a'). In addition, a relational expression of characteristics (a5) is more preferable to be the following expression (a''), and particularly preferable to be the following expression (a'''). Satisfaction of these conditions provides still more good balance between rigidity and cross-linking efficiency of the resin composition.

$$-0.67 \times E + 100 \geq N \geq -0.67 \times E + 53 \quad \text{Expression (a')}$$

$$-0.67 \times E + 80 \geq N \geq -0.67 \times E + 53 \quad \text{Expression (a'')}$$

$$-0.67 \times E + 75 \geq N \geq -0.67 \times E + 54 \quad \text{Expression (a''')}$$

(a6) Flow Ratio (FR)

The ethylene.α-olefin copolymer to be used in the present invention preferably has the flow ratio (FR), that is, the ratio ($I_{10}/I_{2.16}$) of $I_{10}$ which is an MFR measured value at 190° C. under a load of 10 kg, and $I_{2.16}$ which is an MFR measured value at 190° C. under a load of 2.16 kg, of below 7.0. It should be noted that melt flow ratio (MFR) is a value measured in accordance with JIS-K7210-1999.

It has been known that FR has close relationship with molecular weight distribution and amount of a long chain branch of the ethylene.α-olefin copolymer. In the present invention, among polymers satisfying the above requisites (a1) to (a4), such one is used that has the ratio ($I_{10}/I_{2.16}$) of an MFR measured value ($I_{10}$) at 190° C. under a load of 10 kg, and an MFR measured value ($I_{2.16}$) at 190° C. under a load of 2.16 kg of below 7.0. Use of a copolymer having a polymer structure characterized in such a long chain branch provides good balance rigidity and cross-linking efficiency. On the other hand, the FR of 7.0 or more tends to deteriorate cross-linking efficiency in cross-linking as the solar cell encapsulant.

The FR of the ethylene.α-olefin copolymer to be used in the present invention is below 7.0, preferably below 6.5, and more preferably below 6.3. It should be noted that FR below 5.0 has difficulty in obtaining sufficient rigidity as the solar cell encapsulant. The flow ratio (FR) of characteristics (a6) is most preferably 5.0 to 6.2

(2) Component (B)

The organic peroxide of the component (B) in the present invention is used to cross-link mainly the component (A).

As the organic peroxide, the organic peroxide having a decomposition temperature (temperature where half-life period is 1 hour) of 70 to 180° C., in particular, 90 to 160° C. may be used. As such organic peroxide, there is included, for example, t-butylperoxy isopropyl carbonate, t-butylperoxy-2-ethylhexyl carbonate, t-butyl peroxyacetate, t-butyl peroxybenzoate, dicumyl peroxide, 2,5-dimethyl-2,5-di(t-butylperoxy)hexane, di-t-butyl peroxide, 2,5-dimethyl-2,5-di(t-butylperoxy)hexyne-3,1,1-di(t-butylperoxy)-3,3,5-trimethylcyclohexane, 1,1-di(t-butylperoxy)cyclohexane, methyl ethyl ketone peroxide, 2,5-dimethyhexyl-2,5-diperoxybenzoate, t-butyl hydroperoxide, p-menthane hydroperoxide, benzoyl peroxide, p-chlorbenzoyl peroxide, t-butyl peroxyisobutyrate, hydroxyheptyl peroxide, cyclohexanone peroxide.

The blending ratio of the component (B) is preferably 0.2 to 5 parts by weight, more preferably 0.5 to 3 parts by weight, and still more preferably 1 to 2 parts by weight, based on 100 parts by weight of the component (A). The blending ratio of the component (B) lower than the above range tends not to provide cross-linking or tend to take longer time in cross-linking and the ratio higher than the above range provides insufficient dispersion and tends to provide a non-uniform cross-linking degree.

(3) Component (C)

The component (C) to be used in the resin composition of the present invention is the silane coupling agent, and is used mainly to enhance adhesive strength between the upper protecting material of the solar cell and the solar cell element.

As the silane coupling agent in the present invention, there is included, for example, γ-chloropropyltrimethoxysilane; vinyltrichlorosilane; vinyltriethoxysilane; vinyltrimethoxysilane; vinyl-tris-(β-methoxyethoxy)silane; γ-methacryloxypropyltrimethoxysilane; β-(3,4-epoxycyclohexyl)ethyltrimethoxysilane; γ-glycidoxypropyltrimethoxysilane; vinyltriacetoxysilane; γ-mercaptopropyltrimethoxysilane; γ-aminopropyltrimethoxysilane; N-β-(aminoethyl)-γ-aminopropyltrimethoxysilane, 3-acryloxypropyltrimethoxysilane or the like. It is preferably vinyltrimethoxysilane, γ-methacryloxypropyltrimethoxysilane, and 3-acryloxypropyltrimethoxysilane.

These silane coupling agents are used in an amount of 0.01 to 5 parts by weight, preferably 0.01 to 2 parts by weight, more preferably 0.05 to 1 part by weight, relative to 100 parts by weight of the ethylene.α-olefin copolymer.

(4) Hindered Amine-type Light Stabilizer (D)

In the present invention, it is preferable to blend the hindered amine-type light stabilizer to the resin composition. The hindered amine-type light stabilizer is the one which captures radical species hazardous to a polymer and inhibits generation of new radicals. As the hindered amine-type light stabilizer, there are many kinds of compounds from a low molecular weight-type to a high molecular weight-type, and it can be used without any special limitation, as long as it is a conventionally known one.

As the low molecular weight-type hindered amine-type light stabilizer, there is included the one composed of 70% by weight of a reaction product of bis(2,2,6,6-tetramethyl-1-(octyloxy)-4-piperidinyl) decanedioate (molecular weight: 737), 1,1-dimethyethyl hydroperoxide, and octane and 30% by weight of polypropylene; bis(1,2,2,6,6-pentamethyl-4-piperidyl) [[3,5-bis(1,1-dimethylethyl)-4-hydroxyphenyl]methyl]butyl malonate (molecular weight: 685); a mixture of bis(1,2,2,6,6-pentamethyl-4-piperidyl)sebacate and methyl 1,2,2,6,6-pentamethyl-4-piperidyl sebacate (molecular weight: 509); bis(2,2,6,6-tetramethyl-4-piperidyl) sebacate (molecular weight: 481); tetrakis(2,2,6,6-tetramethyl-4-piperidyl)-1,2,3,4-butane tetracarboxylate (molecular weight: 791); tetrakis(1,2,2,6,6-pentamethyl-4-piperidyl)-1,2,3,4-butane tetracarboxylate (molecular weight: 847); a mixture of 2,2,6,6-tetramethyl-4-piperidyl-1,2,3,4-butanetetracarboxylate and tridecyl-1,2,3,4-butane tetracarboxylate (molecular weight: 900); a mixture of 1,2,2,6,6-pentamethyl-4-piperidyl-1,2,3,4-butane tetracarboxylate and tridecyl-1,2,3,4-butane tetracarboxylate (molecular weight: 900) or the like.

As the high molecular weight-type hindered amine-type light stabilizer, there is included poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}] (molecular weight: 2,000-3,100); a polymerization product of dimethyl succinate and 4-hydroxy-2,2,6,6-tetramethyl-1-piperidine ethanol (molecular weight: 3100-4000); a mixture of N,N',N'',N'''-tetrakis-(4,6-bis-(butyl-(N-methyl-2,2,6,6-tetramethylpiperidine-4-yl) amino)-triazine-2-yl)-4,7-diazadecane-1,10-diamine (molecular weight: 2286) and the above-described polymerization product between dimethyl succinate and 4-hydroxy-2,2,6,6-tetramethyl-1-piperidine ethanol; a polycondensate (molecular weight: 2600-3400) of dibutylamine-1,3,5-triazine-N,N'-bis(2,2,6,6-tetramethyl-4-piperidyl-1,6-hexamethylene diamine and N-(2,2,6,6-tetramethyl-4-piperidyl)butylamine, and a copolymer of a cyclic aminovinyl compound such as 4-acryloyloxy-2,2,6,6-tetramethylpiperidine, 4-acryloyloxy-1,2,2,6,6-pentamethylpiperidine, 4-acryloyloxy-1-ethyl-2,2,6,6-tetramethylpiperidine, 4-acryloyloxy-1-propyl-2,2,6,6-tetramethylpiperidine, 4-acryloyloxy-1-butyl-2,2,6,6-tetramethylpiperidine, 4-methacryloyoxy-2,2,6,6-tetramethylpiperidine, 4-methacryloyoxy-1,2,2,6,6-pentamethylpiperidine, 4-methacryloyoxy-1-ethyl-2,2,6,6-tetramethylpiperidine, 4-methacryloyoxy-1-butyl-2,2,6,6-tetramethylpiperidine, 4-crotonoyloxy-2,2,6,6-tetramethylpiperidine, 4-crotonoyloxy-1-propyl-2,2,6,6-tetramethylpiperidine, and ethylene; and the like. The above hindered amine-type light stabilizers may be used alone or by mixing two or more kinds.

Among these, as the hindered amine-type light stabilizer, it is preferable to use poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}] (molecular weight: 2,000-3,100); a polymerization product (molecular weight: 3100-4000) of dimethyl succinate and 4-hydroxy-2,2,6,6-tetramethyl-1-piperidine ethanol; a mixture of N,N',N'',N'''-tetrakis-(4,6-bis (butyl-(N-methyl-2,2,6,6-tetramethylpiperidine-4-yl) amino)-triazine-2-yl)-4,7-diazadecane-1,10-diamine (molecular weight: 2286) and the above polymerization product of dimethyl succinate and 4-hydroxy-2,2,6,6-tetramethyl-1-piperidine ethanol; a polycondensate (molecular weight: 2,600-3,400) of dibutylamine-1,3,5-triazine-N,N'-bis(2,2,6,6-tetramethyl-4-piperidyl-1,6-hexamethylene diamine and N-(2,2,6,6-tetramethyl-4-piperidyl)butylamine; a copolymer of a cyclic aminovinyl compound and ethylene. It is because bleeding out with time of the hindered amine-type light stabilizer can be prevented in use of a product. In addition, it is preferable to use the hindered amine-type light stabilizer having a melting point of 60° C. or higher, in view of easiness in preparing the composition.

In the present invention, content of the hindered amine-type light stabilizer is set at 0.01 to 2.5 parts by weight, preferably 0.01 to 1.0 part by weight, more preferably 0.01 to 0.5 parts by weight, still more preferably 0.01 to 0.2 parts by weight, and most preferably 0.03 to 0.1 parts by weight, relative to 100 parts by weight of the above ethylene.α-olefin copolymer.

By setting the above content at 0.01 parts by weight or more, sufficient stabilization effect can be obtained, while by setting it at 2.5 parts by weight or less, discoloration of a resin caused by excess addition of the hindered amine-type light stabilizer can be suppressed.

In addition, weight ratio (B:D) of the above organic peroxide (B) and the above hindered amine light stabilizer (D) is set 1:0.01 to 1:10, and preferably 1:0.02 to 1:6.5. In this way, yellowing of a resin can be suppressed significantly.

(5) Cross-linking Auxiliary Agent

In addition, the cross-linking auxiliary agent may be blended into the resin composition of the present invention. The cross-linking auxiliary agent promotes a cross-linking reaction and is effective to enhance cross-linking degree of the ethylene.α-olefin copolymer, and as a specific example thereof, a poly-unsaturated compound such as a polyallyl compound and a poly(meth)acryloyloxy compound may be exemplified.

More specifically, there may be included a polyallyl compound such as triallyl isocyanurate, triallyl cyanurate, diallyl phthalate, diallyl fumarate, or diallyl maleate; a poly(meth)acryloxy compound such as ethylene glycol diacrylate, ethylene glycol dimethacrylate, or trimethylolpropane trimethacrylate; and divinylbenzene; or the like. The cross-linking auxiliary agent may be blended in a ratio of about 0 to 5 parts by weight, relative to 100 parts by weight of the component (A).

(6) Ultraviolet Absorbing Agent

The ultraviolet absorbing agent may be blended into the resin composition of the present invention. As the ultraviolet absorbing agent, various types such as benzophenone-type, benzotriazole-type, triazine-type, and salicylate ester-type may be included.

The benzophenone-type ultraviolet absorbing agent may include, for example, 2-hydroxy-4-methoxybenzophenone, 2-hydroxy-4-methoxy-2'-carboxybenzophenone, 2-hydroxy-4-n-octoxybenzophenone, 2-hydroxy-4-n-dodecyloxybenzophenone, 2-hydroxy-4-n-octadecyloxybenzophenone, 2-hydroxy-4-benzyloxybenzophenone, 2-hydroxy-4-methoxy-5-sulfobenzophenone, 2-hydroxy-5-chlorobenzophenone, 2,4-dihydroxybenzophenone, 2,2'-dihydroxy-4-methoxybenzophenone, 2,2'-dihydroxy-4,4'-dimethoxybenzophenone, or 2,2',4,4'-tetrahydroxybenzophenone, or the like.

The benzotriazole-type ultraviolet absorbing agent is a hydroxyphenyl substituted benzotriazole compound, may include, for example, 2-(2-hydroxy-5-methylphenyl)benzotriazole, 2-(2-hydroxy-5-t-butylphenyl)benzotriazole, 2-(2- hydroxy-3,5-dimethyphenyl)benzotriazole, 2-(2-methyl-4-hydroxyphenyl)benzotriazole, 2-(2-hydroxy-3-methyl-5-t-butylphenyl)benzotriazole, 2-(2-hydroxy-3,5-di-t-amylphenyl)benzotriazole, 2-(2-hydroxy-3,5-di-t-butylphenyl)benzotriazole or the like. In addition, the triazine type ultraviolet absorber includes, 2-[4,6-bis(2,4-dimethyphenyl)-1,3,5-triazine-2-yl]-5-(octyloxy)phenol, 2-(4,6-diphenyl-1,3,5-triazine-2-yl)-5-(hexyloxy)phenol or the like. The salicylic acid ester type includes phenyl salicylate, p-octylphenyl salicylate or the like.

These ultraviolet absorbing agents is blended in an amount of 0 to 2.0 parts by weight, preferably 0.05 to 2.0 parts by weight, more preferably 0.1 to 1.0 part by weight, still more preferably 0.1 to 0.5 parts by weight, and most preferably 0.2 to 0.4 parts by weight, relative to 100 parts by weight of the ethylene.α-olefin copolymer.

(7) Other Additive Components

Other additive arbitrary components can be blended in this resin composition within a range not to impair objectives of the present invention. Such an arbitrary additive component includes an antioxidant, a crystallization nucleating agent, a transparency enhancing agent, a lubricant, a coloring agent, a dispersing agent, a filler, a fluorescent whitening agent, a ultraviolet absorbing agent, a light stabilizer, which are used in a usual polyolefin-type resin material, or the like.

In addition, a rubber-type compound such as a crystalline ethylene.α-olefin copolymer obtained by polymerization using a Ziegler-type or a metallocene-type catalyst; and/or ethylene.α-olefin elastomer such as EBR or EPR; or styrene-type elastomer such as SEBS, a hydrogenated styrene block copolymer or the like can also be blended into the resin composition in amount of 3 to 75 parts by weight, relative to 100 parts by weight of the above resin composition, in order to provide flexibility or the like, within a range not to impair objectives of the present invention. Still more, in order to provide melt tension or the like, low density polyethylene produced by a high pressure method can also be blended in 3 to 75 parts by weight as well.

2. Solar Cell Encapsulant

The solar cell encapsulant (hereinafter may be referred to simply as the encapsulant) of the present invention is the one prepared using the above resin component, and it is used by pelletizing or sheet-forming the above resin composition.

The solar cell encapsulant of the present invention may be pelletized, however, it is used by forming to a sheet-shape with a thickness of usually about 0.1 to 1 mm. The thickness less than 0.1 mm provides weak strength and insufficient adhesion, while the thickness more than 1 mm may raise a problem caused by decreased transparency. Preferable thickness is 0.1 to 0.8 mm.

A sheet-like solar cell encapsulant can be produced by a known sheet molding method, such as calendering molding using a calendering machine. The calendering molding is a method for making a sheet by rolling a resin material, while melting using heating rolls, and passing it through several rolls.

In the calendering, after adding the silane coupling agent and a cross-linking agent to the ethylene.α-olefin copolymer, and dry blending the additives such as a hindered amine-type light stabilizer, and still more a cross-linking auxiliary agent, an ultraviolet absorbing agent, an antioxidant, a light stabilizer, as needed, in advance, for melt kneading, the kneaded substance is carried using a conveyor for supplying to a mixing roll. In this dry blending, a part of or all of the additives can be used in a form of a master batch. In addition, such a resin composition which is obtained by melt mixing a part of or all of the additives to the amorphous α-olefin-based copolymer, in advance, using a single-screw extruder, a twin-screw extruder, a Banbury mixer and a kneader or the like, can also be used.

The kneaded substance kneaded using the mixing roll is carried using a conveyor, and rolled using four calender rolls heated at 80 to 130° C., and the rolled sheet is taken off using a take-off roll. After that, the rolled sheet is cooled using a cooling roll, and the cooled sheet may be wound using a winding machine.

3. Solar Cell Module

In the present invention, the solar cell module can be produced by using the above solar cell encapsulant, encapsulating the solar cell element, and still more fixing with protecting materials.

As such a solar cell module, various types can be exemplified. For example, there may be exemplified the one having a composition where the solar cell element is sandwiched from both sides thereof with the encapsulant, such as the upper transparent protecting material/the encapsulant/the solar cell element/the encapsulant/the lower protecting material; the one having a composition where the encapsulant and the upper transparent protecting material are formed on the solar cell element formed on the inner circumference plane of the lower substrate protecting material; the one having a composition where the encapsulant and the lower protecting material are formed on the solar cell element formed on the inner circumference plane of the upper transparent protecting material, for example, the one where an amorphous solar cell element is prepared by sputtering or the like on a fluorocarbon resin-type transparent protecting material; or the like.

The solar cell element is not especially limited, and various types of solar cell elements such as a silicon-type such as monocrystalline silicon, polycrystalline silicon or amorphous silicon; a III-V group and II-VI group compound semiconductor type of gallium-arsenic, copper-indium-selenium, cadmium-tellurium or the like, can be used. In the present invention, the one used a glass as a substrate is preferable.

As the upper protecting material composing the solar cell module, glass, acrylic resin, polycarbonate, polyester, fluorine-containing resin or the like can be exemplified. In addition, the lower protecting material is a single or multi-layer sheet of a metal or various thermoplastic resin films and the like, for example, there can be exemplified a single layer or multi-layer protecting film of a metal including tin, aluminum, stainless steel, an inorganic material such as glass, polyester, polyester vapor-deposited with an inorganic substance, a fluorine-containing resin or a polyolefin or the like. To such an upper and/or lower protecting material, primer treatment can be performed to enhance adhesion property with the encapsulant. In the present invention, as the upper protecting material, glass is preferable.

In producing the solar cell module, a module having the aforesaid composition may be formed by a method for preparing a sheet of the encapsulant of the present invention, in advance, and press-adhering it at temperature for melting the resin composition of the encapsulant, for example, 150 to 200° C. In addition, by adopting a method for laminating the solar cell element or the upper protecting material or the lower protecting material, by extrusion coating of the encapsulant of the present invention, the solar cell module can be produced in one stage without sheet molding separately. Use of the encapsulant of the present invention, consequently, is capable of improving productivity of the module significantly.

On the other hand, in producing the solar cell module, by adhering tentatively the solar cell element or said encapsulant to the protecting material at such temperature that the organic peroxide does not substantially decompose and the encapsulant of the present invention melts, and then by raising temperature, sufficient adhesion and cross-linking of the ethylene.α-olefin copolymer may be performed. In this case, in order to obtain the solar cell module having good heat resistance such as a melting point (a DSC method) of the encapsulant layer of 85° C. or higher and a storage elastic modulus at 150° C. of $10^3$ Pa or higher, it is preferable to perform cross-linking so as to obtain a gel fraction (obtained by immersing 1 g of a sample into 100 ml of xylene, heating at 110° C. for 24 hours, and then measuring mass fraction of a unmelted portion by filtering with a 20 mesh metal screen) in the encapsulant layer of 50 to 98%, and preferably about 70 to 95%.

It should be noted that, in the PATENT LITERATURE 3, a sheet with a thickness of 0.5 mm was produced at a processing temperature of 100° C., using a profile extruder, from a mixture obtained by mixing 1.5 parts by weight of 2,5-dimethyl-2,5-di(t-butylperoxy)hexane, as the organic peroxide, and 2 parts by weight of triallyl isocyanurate, as the cross-linking auxiliary agent (Example 3). However, selection of such a composition cannot provide sufficient productivity due to low processing temperature.

In an encapsulation work of the solar cell element, there is a method for covering the solar cell element with the above encapsulant of the present invention, then adhering tentatively it by heating at such temperature that the organic peroxide does not decompose for about several minutes to ten minutes, and then adhering it by heat treating in an oven at high temperature of about 150 to 200° C., at which the organic peroxide decomposes, for 5 minutes to 30 minutes or the like.

EXAMPLES

Explanation will be given below specifically on the present invention with reference to Examples, however, the present invention should not be limited to these Examples. It should be noted that evaluation methods and resins used in Examples and Comparative Examples are as follows.

1. Evaluation Methods for Resin Properties
(1) Melt flow rate (MFR): MFR of the ethylene.α-olefin copolymer was measured in accordance with JIS-K6922-2: 1997 attachment (at 190° C., under a load of 21.18 N).
(2) Density: Density of the ethylene.α-olefin copolymer was measured in accordance with JIS-K6922-2: 1997 attachment (at 23° C., the case of a low density polyethylene), as described above.
(3) Mz/Mn: It was measured by GPC, as described above.
(4) Melt viscosity: Melt viscosity ($\eta^*_1$) under a shear rate of $2.43 \times 10$ sec$^{-1}$, and melt viscosity ($\eta^*_2$) under a shear rate of $2.43 \times 10^2$ sec$^{-1}$ were measured using Capillograph 1-B, manufactured by Toyo Seiki Seisaku-sho Ltd., and using a capillary with D=1 mm, L/D=10, at a set temperature of 100° C., in accordance with JIS-K7199-1999.
(5) Branch number: The branch number (N) in a polymer was measured by NMR under the following conditions, and comonomer amount was determined as number per total 1000 carbons of a main chain and a side chain.

Apparatus: AVANCE III cryo-400 MHz, manufactured by Bruker BioSpin K. K.
Solvent: Ortho-dichlorobenzene/deuterated bromobenzene=8/2 mixed solution
<Amount of Sample>
460 mg/2.3 ml
<C-NMR>
  H-decoupling and NOE present
  Cumulative number: 256 scans
  Flip angle: 90 degree
  Pulse interval: 20 seconds
  AQ (incorporation time): 5.45 s, D1 (waiting time)=14.55 s
(6) FR: Ratio ($I_{10}/I_{2.16}$) of an MFR measured value ($I_{10}$) at 190° C. under a load of 10 kg, and an MFR measured value ($I_{2.16}$) at 190° C. under a load of 2.16 kg was calculated, in accordance with JIS-K7210-1999, to be used as FR.

2. Evaluation Methods for Extrusion Molding (Sheet)
(1) Calendering Property
After melt kneading the resin composition, it was fed to a calendering machine, and extruded to a sheet-like form using a calender roll. Temperature of the calender roll was set at 100° C., and rotation speed at 10 m/minute. In that case, criteria of evaluation of calendering property were as follows: good calendering property (o), for the case capable of forming using the calender roll; on the other hand, poor calendering property (x), for the case incapable of forming.
(2) Haze
It was measured using a pressed sheet with a thickness of 0.7 mm, in accordance with JIS-K7136-2000. The pressed sheet was set in a glass cell filled with special grade liquid paraffin, produced by Kanto Chemical Co., Inc., to measure haze. The pressed sheet was prepared by storing it in a hot press machine under a temperature condition of 160° C. for 30 minutes for cross-linking. The smaller HAZE value shows the better performance.
(3) Light Transmittance
It was measured using a pressed sheet with a thickness of 0.7 mm, in accordance with JIS-K7361-1997. The pressed sheet was set in a glass cell filled with special grade liquid paraffin, produced by Kanto Chemical Co., Inc., to measure light transmittance. The pressed sheet was prepared by storing it in a hot press machine under a temperature condition of 160° C. for 30 minutes for cross-linking.
Light transmittance is 80% or more, preferably 85% or more, and still preferably 90% or more.
(4) Modulus of Elasticity in Tension
Modulus of elasticity in tension was measured using a pressed sheet with a thickness of 0.7 mm, cross-linked at 160° C. for 30 minutes in accordance with ISO1184-1983. It should be noted that modulus of elasticity in tension was determined at an elongation rate of 1%, under conditions of an elongation speed of 1 mm/min, a test piece width of 10 mm, and a distance between grippers of 100 mm. The smaller value shows the more superior flexibility.
(5) Heat Resistance
It was evaluated by gel fraction of a sheet cross-linked at 160° C., and a sheet cross-linked at 150° C. for 30 minutes. The higher gel fraction shows more progress of cross-linking and is evaluated as having higher heat resistance. The one with the gel fraction of 70% by weight or more was ranked "o" in evaluation of heat resistance. It should be noted that the gel fraction is calculated by accurately weighing about 1 g of the relevant sheet, immersing it in 100 cc of xylene, treating it at 110° C. for 24 hours, drying the residue after filtration, accurately weighing, and dividing it with weight before the treatment.

(6) Adhesion Property with Glass

A slide glass with a size of 7.6 cm×2.6 cm and a thickness of 1 mm was used. The resin composition was contacted with the slide glass, and performed heating under a condition of 160° C. for 30 minutes, using a press machine. Evaluation was performed after standing it in atmosphere of 23° C. for 24 hours, and ranked [x] when the resin was peeled from the slide glass by hands, and [o] when it was not peeled.

3. Raw Materials Used (1) Component (A): Ethylene.α-olefin copolymer

A copolymer of ethylene and 1-hexene polymerized in the following <Production Example 1> (PE-1), a copolymer of ethylene and 1-butene polymerized in <Production Example 2> (PE-2), (PE-3), copolymers of ethylene and 1-hexene polymerized in <Production Example 3 and 4> (PE-3) (PE-4), a copolymer of ethylene, propylene and 1-hexene polymerized in <Production Example 5> (PE-9) and commercially available ethylene.α-olefin copolymers (PE-5) (PE-6) (PE-7) (PE-8) were used. The properties are shown in Table 1.

(2) Organic peroxide: 2,5-dimethyl-2,5-di(t-butylperoxy) hexane (Luperox 101, produced by Arkema-Yoshitomi Co. Ltd.)

(3) Silane coupling agent: γ-methacryloxypropyltrimethoxysilane (KBM503, produced by Shin-Etsu Chemical Co., Ltd.)

(4) Hindered amine-type light stabilizer: a polymerization product of dimethyl succinate and 4-hydroxy-2,2,6,6-tetramethyl-1-piperidine ethanol (TINUVIN 622LD, produced by BASF AG.)

(6) Ultraviolet absorbing agent: 2-hydroxy-4-n-octoxybenzophenone (CYTEC UV531, produced by Sun Chemical Co. Ltd.)

Production Example 1

(i) Preparation of Catalyst

A catalyst for producing a copolymer of ethylene and 1-hexene was prepared by a method described in JP-A-7-508545. That is, into 2.0 mmol of a complex of dimethylsilylenebis(4,5,6,7-tetrahydroindenyl)hafnium dimethyl, equimolar amount of tripentafluorophenylboron, based on the above complex, was added, and by dilution with toluene to 10 L, a catalyst solution was prepared.

(ii) Polymerization

Using a stirring-type autoclave-type continuous reactor with an inner volume of 1.5 L, a mixture of ethylene and 1-hexene, as a raw material gas, was continuously supplied in a rate of 40 kg/hr, so that the composition of 1-hexene was 72% by weight, under maintaining pressure inside the reactor at 130 MPa. In addition, the above catalyst solution was supplied continuously by adjusting supply amount thereof so as to maintain polymerization temperature at 150° C. Production amount of the polymer was about 1.5 kg per hour. After completion of the reaction, the ethylene.1-hexene copolymer (PE-1), with a content of 1-hexene of 24% by weight, an MFR of 1.0 g/10 min, a density of 0.880 g/cm$^3$, and a Mz/Mn of 3.7, was obtained.

In addition, after preheating the PE-1 at 160° C.-0 kg/cm$^2$ for 3 minutes, it was pressurized at 160° C.-100 kg/cm$^2$ for 5 minutes, and then by cooling it with a cooling press set at 30° C., under a condition of 100 kg/cm$^2$ for 10 minutes, a pressed sheet with a thickness of 0.7 mm was obtained. As a result of performing measurement of modulus of elasticity in tension thereof, in accordance with ISO1184-1983, it was 17 MPa.

Characteristics of this ethylene.1-hexene copolymer (PE-1) are shown in Table 1.

Production Example 2

Polymerization was performed by changing monomer composition and polymerization temperature in polymerization in Production Example 1, so as to attain composition, density and melt viscosity shown in Table 1. After completion of the reaction, the ethylene.1-butene copolymer (PE-2), with content of 1-butene=35% by weight, MFR=1.0 g/10 min, density=0.870 g/cm$^3$, and Mz/Mn=3.5, was obtained. As a result of performing measurement of modulus of elasticity in tension thereof, similarly as in Production Example 1, it was found to be 8 MPa. Characteristics of this ethylene.1-butene copolymer (PE-2) are shown in Table 1.

Production Example 3

Polymerization was performed by a similar method as in Production Example 1, except that composition of 1-hexene in polymerization was changed to 72% by weight and polymerization temperature was changed to 122° C. in Production Example 1. Production amount of the polymer was about 2.1 kg per hour. After completion of the reaction, the ethylene.1-hexene copolymer (PE-3), with content of 1-hexene=24% by weight, MFR=2.2 g/10 min, density=0.880 g/cm$^3$, and Mz/Mn=3.7, was obtained. As a result of performing measurement of modulus of elasticity in tension thereof, similarly as in Production Example 1, it was found to be 17 MPa. Characteristics of this ethylene.1-hexene copolymer (PE-3) are shown in Table 1.

Production Example 4

Polymerization was performed by a similar method as in Production Example 1, except that composition of 1-hexene in polymerization was changed to 75% by weight and polymerization temperature was changed to 150° C. in Production Example 1. Production amount of the polymer was about 4.3 kg per hour. After completion of the reaction, the ethylene.1-hexene copolymer (PE-4), with content of 1-hexene=24% by weight, MFR=35 g/10 min, density=0.880 g/cm$^3$, and Mz/Mn=3.7, was obtained. As a result of performing measurement of modulus of elasticity in tension thereof, similarly as in Production Example 1, it was found to be 34 MPa. Characteristics of this ethylene.1-hexene copolymer (PE-4) are shown in Table 1.

Production Example 5

Polymerization was performed by changing monomer composition and polymerization temperature in polymerization in Production Example 1, so as to attain the composition, density and melt viscosity shown in Table 1. After completion of the reaction, the ethylene.propylene.1-hexene copolymer (PE-9), having content of propylene=14.4% by weight, content of 1-hexene=11.9% by weight, MFR=1.0 g/10 min, density=0.870 g/cm$^3$, and Mz/Mn=3.5, was obtained. As a result of performing measurement of modulus of elasticity in tension thereof, similarly as in Production Example 1, it was found to be 8 MPa. Characteristics of this ethylene/propylene/1-hexene copolymer (PE-9) are shown in Table 1.

TABLE 1

| | Polymerization Catalyst | Content of α-olefin* wt % | Density g/cm³ | Mz/Mn | Branch No. No./total 1000 C | Modulus of elasticity in tension Mpa | $\eta^*_1$ poise | $\eta^*_2$ poise | $\eta^*_1/\eta^*_2$ | FR |
|---|---|---|---|---|---|---|---|---|---|---|
| PE-1 | Production Example 1 | Metallocene | 24 (C6) | 0.880 | 3.7 | 44 | 17 | $1.7 \times 10^5$ | $2.7 \times 10^4$ | 6.3 | 5.9 |
| PE-2 | Production Example 2 | Metallocene | 35 (C4) | 0.870 | 3.5 | 67 | 8 | $1.7 \times 10^5$ | $2.7 \times 10^4$ | 6.3 | 5.9 |
| PE-3 | Production Example 3 | Metallocene | 24 (C6) | 0.880 | 3.7 | 44 | 17 | $1.3 \times 10^5$ | $2.1 \times 10^4$ | 1.9 | 5.9 |
| PE-4 | Production Example 4 | Metallocene | 24 (C6) | 0.880 | 3.7 | 44 | 17 | $2.3 \times 10^4$ | $1.2 \times 10^4$ | 1.9 | 5.9 |
| PE-5 | TufmerA4085S | — | 19 (C4) | 0.885 | 3.5 | 53 | 27 | $9.2 \times 10^4$ | $1.9 \times 10^4$ | 4.8 | 5.9 |
| PE-6 | ENGAGE 8100 | — | 36 (C8) | 0.870 | 3.6 | 45 | 8 | $1.4 \times 10^5$ | $2.3 \times 10^4$ | 6.1 | 7.5 |
| PE-7 | ENGAGE 8200 | — | 36 (C8) | 0.870 | 3.6 | 45 | 8 | $7.8 \times 10^4$ | $2.0 \times 10^4$ | 3.9 | 7.5 |
| PE-8 | ENGAGE 8400 | — | 36 (C8) | 0.870 | 3.2 | 45 | 8 | $2.6 \times 10^4$ | $1.0 \times 10^4$ | 2.6 | 7.5 |
| PE-9 | Production Example 5 | Metallocene | 14.4 (C3) 11.9 (C6) | 0.870 | 3.5 | 73.5 | 8 | $1.7 \times 10^5$ | $2.7 \times 10^4$ | 6.3 | 5.9 |

(Note):
(C3), (C4), (C6) and (C8) are carbon numbers of an α-olefin used as a comonomer.

Example 1

To 100 parts by weight of a copolymer of ethylene and 1-hexene (PE-1), as the organic peroxide, 1.5 parts by weight of 2,5-dimethyl-2,5-di(t-butylperoxy)hexane (Luperox 101, produced by ARKEMA YOSHITOMI, LTD), and as a hindered amine light-stabilizer, 0.05 parts by weight of a polymer product of dimethyl succinate and 4-hydroxy-2,2,6,6-tetramethyl-1-piperidine ethanol (TINUVIN 622LD, manufactured by BASF) were blended. After melt kneading the resin composition using a Banbury mixer, it was fed to a calendering machine, and extrusion molded to a sheet-like form using a calender roll. Temperature of the calender roll was set at 100° C., and rotation speed was set at 10 m/minute.

After preheating the obtained sheet under a condition of 160° C.-0 kg/cm² for 3 minutes, it was pressurized under a condition of 160° C.-100 kg/cm² for 27 minutes (press molding at 160° C. for 30 minutes), and then by cooling it to a cooling press set at 30° C., under a condition of 100 kg/cm² for 10 minutes, a sheet with a thickness of 0.7 mm was prepared. Calendering property, haze, light transmittance, modulus of elasticity in tension and heat resistance of the sheet were measured and evaluated.

In addition, for a separate evaluation of heat resistance, after preheating the sheet under a condition of 150° C.-0 kg/cm² for 3 minutes, it was pressurized under a condition of 150° C.-100 kg/cm² for 27 minutes (press molding at 150° C. for 30 minutes), and then by cooling it with a cooling press set at 30° C., under a condition of 100 kg/cm² for 10 minutes, a sheet with a thickness of 0.7 mm was prepared. Evaluation results are shown in Table 2.

Example 2

A sheet was prepared similarly, except that PE-2 was used instead of PE-1, in Example 1. Calendering property, haze, light transmittance, modulus of elasticity in tension and heat resistance of the sheet were measured and evaluated. Evaluation results are shown in Table 2.

Example 3

A sheet was prepared similarly, except that PE-3 was used instead of PE-1, in Example 1. Calendering property, haze, light transmittance, modulus of elasticity in tension and heat resistance of the sheet were measured and evaluated. Evaluation results are shown in Table 2.

Example 4

A sheet was prepared similarly as in Example 1, except that 0.3 parts of 2-hydroxy-4-n-octoxybenzophenone (CYTEC UV531, manufactured by Sun Chemical Co. Ltd.) was further added as an ultraviolet absorbing agent in Example 3. Calendering property, haze, light transmittance, modulus of elasticity intension and heat resistance of the sheet were measured and evaluated. Evaluation results are shown in Table 2.

Example 5

A sheet was prepared similarly, except that PE-9 was used instead of PE-1, in Example 1. Calendering property, haze, light transmittance, modulus of elasticity in tension and heat resistance of the sheet were measured and evaluated. Evaluation results are shown in Table 2.

Comparative Example 1

A sheet was prepared similarly as in Example 1, except that the organic peroxide was not used. Calendering property, haze, light transmittance, modulus of elasticity in tension, heat resistance and adhesive property of the sheet were measured and evaluated. Evaluation results are shown in Table 2.

Comparative Example 2

Calendering molding was tried similarly as in Example 1, except that PE-4 for comparison (ethylene.1-octene copolymer) was used instead of PE-1 in Example 1. However, calendering molding was impossible because of insufficient melt tension.

Comparative Example 3

Calendering was tried similarly as in Example 1, except that PE-5 (ethylene.1-butene copolymer, Tufiner A4085S, produced by Mitsui Chemical Co., Ltd.) was used instead of PE-1. However, calendering molding was impossible because of insufficient melt tension.

Comparative Example 4

A sheet was prepared similarly as in Example 1, except that PE-6 (ethylene.1-octene copolymer, Engage 8100, produced by Dow Chemical Co., Ltd.) was used instead of PE-1. Calendering property, haze, light transmittance, modulus of elasticity in tension and heat resistance of the sheet were measured and evaluated. Evaluation results are shown in Table 2. This sheet had poor cross-linking efficiency, resulting in inferior heat resistance.

Comparative Examples 5 and 6

Calendering molding was tried similarly as in Example 1, except that PE-7 (ethylene.1-octene copolymer, produced by Dow Chemical Co., Ltd; ENGAGE-8200), or PE-8 (ethylene.1-octene copolymer, produced by Dow Chemical Co., Ltd; ENGAGE-8400) was used instead of PE-1. However, calendering molding was impossible because of insufficient melt tension.

condition of 160° C.-100 kg/cm$^2$ for 27 minutes (press molding at 160° C. for 30 minutes), and then by cooling it with a cooling press set at 30° C., under a condition of 100 kg/cm$^2$ for 10 minutes, a sheet with a thickness of 0.7 mm was prepared. Calendering property, haze, light transmittance, modulus of elasticity in tension and heat resistance of the sheet were measured and evaluated.

In addition, for a separate evaluation of heat resistance, after preheating the sheet under a condition of 150° C.-0 kg/cm$^2$ for 3 minutes, it was pressurized under a condition of 150° C.-100 kg/cm$^2$ for 27 minutes (press molding at 150° C. for 30 minutes), and then by cooling it with a cooling press set at 30° C., under a condition of 100 kg/cm$^2$ for 10 minutes, a sheet with a thickness of 0.7 mm was prepared. Evaluation results are shown in Table 3.

Example 7

A sheet was prepared similarly, except that PE-2 was used instead of PE-1 in Example 6. Calendering property, haze,

TABLE 2

| | | | Example 1 | Example 2 | Example 3 | Example 4 | Example 5 | Comparative Example 1 | Comparative Example 2 | Comparative Example 3 | Comparative Example 4 | Comparative Example 5 | Comparative Example 6 |
|---|---|---|---|---|---|---|---|---|---|---|---|---|---|
| ethylene•α-olefin copolymer | PE-1 | Parts by weight | 100 | — | — | 100 | — | 100 | — | — | — | — | — |
| | PE-2 | | — | 100 | — | — | — | — | — | — | — | — | — |
| | PE-3 | | — | — | 100 | — | — | — | — | — | — | — | — |
| | PE-4 | | — | — | — | — | — | — | 100 | — | — | — | — |
| | PE-5 | | — | — | — | — | — | — | — | 100 | — | — | — |
| | PE-6 | | — | — | — | — | — | — | — | — | 100 | — | — |
| | PE-7 | | — | — | — | — | — | — | — | — | — | 100 | — |
| | PE-8 | | — | — | — | — | — | — | — | — | — | — | 100 |
| | PE-9 | | — | — | — | — | 100 | — | — | — | — | — | — |
| Satisfaction of expression (a) | | | ○ | ○ | ○ | ○ | ○ | ○ | ○ | ○ | x | x | x |
| Organic peroxide | | | 1.5 | 1.5 | 1.5 | 1.5 | 1.5 | 0 | 1.5 | 1.5 | 1.5 | 1.5 | 1.5 |
| Hindered amine | | | 0.05 | 0.05 | 0.05 | 0.05 | 0.05 | 0.05 | 0.05 | 0.05 | 0.05 | 0.05 | 0.05 |
| UV absorbing agent | | | — | — | — | 0.3 | — | — | — | — | — | — | — |
| Calendering property | | ° C. | ○ | ○ | ○ | ○ | ○ | ○ | x | x | ○ | x | x |
| Haze | | % | 4.4 | 2.5 | 4.4 | 4.5 | 2.3 | 4.4 | — | — | 2.5 | — | — |
| Light transmittance | | % | 91 | 91 | 91 | 91 | 91 | 91 | — | — | 91 | — | — |
| Modulus of elasticity in tension | | Mpa | 18 | 9 | 18 | 18 | 9 | 18 | — | — | 9 | — | — |
| Heat resistance (160° C. × 30 min) | | | — | ○ | ○ | ○ | ○ | ○ | x | — | ○ | — | — |
| Heat resistance (150° C. × 30 min) | | | — | ○ | ○ | ○ | ○ | ○ | x | — | x | — | — |

Example 6

To 100 parts by weight of a copolymer of ethylene and 1-hexene (PE-1), as silane coupling agent, 0.3 parts by weight of γ-methacryloxypropyltrimethoxysilane (KBM-503, produced by Shin-Etsu Chemical Co., Ltd), as organic peroxide, 1.5 parts by weight of 2,5-dimethyl-2,5-di(t-butylperoxy)hexane (Luperox 101, manufactured by ARKEMA YOSHITOMI, LTD), and as hindered amine type light-stabilizer, 0.05 parts by weight of a polymer product of dimethyl succinate and 4-hydroxy-2,2,6,6-tetramethyl-1-piperidine ethanol (TINUVIN 622LD, produced by BASF) are blended. After melt kneading the resin composition using a Banbury mixer, it was fed to a calendering machine, and extrusion molded to a sheet-like form using a calender roll. Temperature of the calender roll was set at 100° C., and rotation speed was set at 10 m/minute.

After preheating the obtained sheet under a condition of 160° C.-0 kg/cm$^2$ for 3 minutes, it was pressurized under a light transmittance, modulus of elasticity in tension and heat resistance of the sheet were measured and evaluated. Evaluation results are shown in Table 3.

Example 8

A sheet was prepared similarly, except that PE-3 was used instead of PE-1 in Example 6. Calendering property, haze, light transmittance, modulus of elasticity in tension and heat resistance of the sheet were measured and evaluated. Evaluation results are shown in Table 3.

Example 9

A sheet was produced similarly as in Example 1, except that 0.3 parts of 2-hydroxy-4-n-octoxybenzophenone (CYTEC UV531, produced by Sun Chemical Co. Ltd.) was further added, as an ultraviolet absorbing agent, in Example 6. Calendering property, haze, modulus of elasticity in tension, heat resistance and adhesive property of the sheet were measured and evaluated. Evaluation results are shown in Table 3.

Example 10

A sheet was prepared similarly, except that PE-9 was used instead of PE-1 in Example 6. Calendering property, haze, light transmittance, modulus of elasticity in tension and heat resistance of the sheet were measured and evaluated. Evaluation results are shown in Table 3.

Comparative Example 7

Calendering molding was tried similarly as in Example 6, except that PE-4 for comparison (ethylene.1-octene copolymer) was used instead of PE-1 in Example 6. However, calendering molding was impossible because of insufficient melt tension.

Comparative Example 8

Calendering molding was tried similarly as in Example 6, except that PE-5 (ethylene.1-butene copolymer, Tufiner A4085S, produced by Mitsui Chemical Co., Ltd.) was used instead of PE-1. However, calendering molding was impossible because of insufficient melt tension.

Comparative Example 9

A sheet was prepared similarly, as in Example 6, except that PE-6 (ethylene.1-octene copolymer, Engage 8100, produced by Dow Chemical Co., Ltd.) was used instead of PE-1. Calendering property, haze, light transmittance, modulus of elasticity in tension and heat resistance of the sheet were measured and evaluated. Evaluation results are shown in Table 3. This sheet had poor cross-linking efficiency, resulting in inferior heat resistance.

Comparative Examples 10 and 11

Calendering molding was tried similarly as in Example 6, except that PE-7 (ethylene.1-octene copolymer, Engage 8200, produced by Dow Chemical Co., Ltd.) or PE-7 (an ethylene/1-octene copolymer, Engage 8400, produced by Dow Chemical Co., Ltd.) was used instead of PE-1. However, calendering molding was impossible because of insufficient melt tension.

TABLE 3

| | | | Example 6 | Example 7 | Example 8 | Example 9 | Example 10 | Comparative Example 7 | Comparative Example 8 | Comparative Example 9 | Comparative Example 10 | Comparative Example 11 |
|---|---|---|---|---|---|---|---|---|---|---|---|---|
| ethylene·α-olefin copolymer | PE-1 | Parts by weight | 100 | — | — | 100 | — | — | — | — | — | — |
| | PE-2 | | — | 100 | — | — | — | — | — | — | — | — |
| | PE-3 | | — | — | 100 | — | — | — | — | — | — | — |
| | PE-4 | | — | — | — | — | — | 100 | — | — | — | — |
| | PE-5 | | — | — | — | — | — | — | 100 | — | — | — |
| | PE-6 | | — | — | — | — | — | — | — | 100 | — | — |
| | PE-7 | | — | — | — | — | — | — | — | — | 100 | — |
| | PE-8 | | — | — | — | — | — | — | — | — | — | 100 |
| | PE-9 | | — | — | — | — | 100 | — | — | — | — | — |
| Satisfaction of formula (a) | | | ○ | ○ | ○ | ○ | ○ | ○ | ○ | x | x | x |
| Organic peroxide | | | 1.5 | 1.5 | 1.5 | 1.5 | 1.5 | 1.5 | 1.5 | 1.5 | 1.5 | 1.5 |
| Hindered amine | | | 0.05 | 0.05 | 0.05 | 0.05 | 0.05 | 0.05 | 0.05 | 0.05 | 0.05 | 0.05 |
| Silane coupling agent | | | 0.3 | 0.3 | 0.3 | 0.3 | 0.3 | 0.3 | 0.3 | 0.3 | 0.3 | 0.3 |
| UV absorbing agent | | | — | — | — | 0.3 | — | — | — | — | — | — |
| Calendering property | | ° C. | ○ | ○ | ○ | ○ | ○ | x | x | ○ | x | x |
| Haze | | % | 4.4 | 2.5 | 4.4 | 4.5 | 2.4 | — | — | 2.5 | — | — |
| Light transmittance | | % | 91 | 91 | 91 | 91 | 91 | — | — | 91 | — | — |
| Modulus of elasticity in tension | | Mpa | 18 | 9 | 18 | 18 | 9 | — | — | 9 | — | — |
| Heat resistance (160° C. × 30 min) | | | — | ○ | ○ | ○ | ○ | ○ | — | — | — | — |
| Heat resistance (150° C. × 30 min) | | | — | ○ | ○ | ○ | ○ | ○ | — | x | — | — |
| Adhesive property (to glass) | | | — | ○ | ○ | ○ | ○ | ○ | — | — | ○ | — |

[Evaluation]

As a result, as is clear from Table 2, in Examples 1 to 5, the specific resin compositions of the present invention are used, which are thus capable of extrusion molding (calendering molding), and the obtained sheets have small haze, large light transmittance, and superior balance between rigidity and cross-linking efficiency. As is clear from Tables 2 and 3, in Examples 6 to 10, the resin compositions containing a coupling agent are used, and thus the obtained sheets are further superior also in adhesion property to glass.

On the other hand, in Comparative Example 1, because the organic peroxide was not used, different from the present invention, heat resistance at 160° C. was not attained. In addition, in Comparative Examples 2, 3, 5, 6, 7, 8, 10 and 11, because the resin compositions containing the ethylene.α-olefin copolymer, having melt viscosity out of the present invention, were used, calendering molding was impossible. In Comparative Example 4, because the resin composition containing an ethylene.1-octene copolymer with the expression (a) and FR out of the present invention was used, the obtained sheet showed poor cross-linking efficiency, resulting in inferior heat resistance.

INDUSTRIAL APPLICABILITY

The present invention can be utilized in manufacturing the solar cell encapsulant, where transparency, flexibility and balance between rigidity and cross-linking efficiency, weather resistance or the like are required, and the solar cell module having high power generation efficiency and improved durability. Blending of the organic peroxide to the resin composition enhances heat resistance, and blending of the silane coupling agent provides good adhesive property to a glass substrate, and in particular, is useful as the encapsulant of a thin film solar cell or a solar cell using a glass plate as a substrate.

It should be noted that the resin composition of the present invention is optimal as the above solar cell encapsulant module, however, other than this, it can be used in manufacturing a water shielding sheet, or Tarpaulin™.

The invention claimed is:

1. A solar cell encapsulant comprising a resin composition, the resin composition comprising:
   (A) an ethylene.α-olefin copolymer satisfying (a1) to (a4) and at least one of (a5) and (a6):
   (a1) a density of 0.860 to 0.920 g/cm$^3$,
   (a2) a ratio, (Mz/Mn), of Z average molecular weight (Mz) and number average molecular weight (Mn) determined by a gel permeation chromatography (GPC), of 8.0 or less,
   (a3) a melt viscosity ($\eta^*_1$) measured at 100° C. under a shear rate of 2.43×10 s$^{-1}$ of 1.2×10$^5$ poise or more,
   (a4) a melt viscosity ($\eta^*_2$) measured at 100° C. under a shear rate of 2.43×10$^2$s$^{-1}$ of 2.0×10$^4$ poise or more,
   (a5) a branch number (N) derived from a comonomer in a polymer that satisfies expression (a):

$N \geq -0.67 \times E + 53$        (a), wherein N represents the branch number per total 1000 carbon atoms in a main chain and a side chain, measured by NMR, and E represents a modulus of elasticity in tension of a sheet, measured in accordance with ISO1184-1983, and
   (a6) a flow ratio (FR) ($I_{10}/I_{2.16}$) of $I_{10}$ which is an MFR measured value at 190° C. under a load of 10 kg, and $I_{2.16}$ which is an MFR measured value at 190° C. under a load of 2.16 kg, of below 7.0; and
   at least one of:
   (B) an organic peroxide; and (C) a silane coupling agent.

2. The solar cell encapsulant of claim 1, wherein (a5) the branch number (N) derived from a comonomer in a polymer satisfies expression (a'):

$-0.67 \times E + 100 \geq N \geq -0.67 \times E + 53$        (a').

3. The solar cell encapsulant of claim 1, wherein (a5) the branch number (N) derived from a comonomer in a polymer satisfies expression (a")

$-0.67 \times E + 80 \geq N \geq -0.67 \times E + 53$        (a").

4. The solar cell encapsulant of claim 1, wherein the flow ratio (FR) of (a6) is 5.0 to 6.2.

5. The solar cell encapsulant of claim 1, wherein the component (B) is present in the resin composition in an amount of 0.2 to 5 parts by weight, relative to 100 parts by weight of the component (A).

6. The solar cell encapsulant of claim 1, wherein the component (C) is present in the resin composition in an amount of 0.01 to 5 parts by weight, relative to 100 parts by weight of the component (A).

7. The solar cell encapsulant of claim 1, further comprising:
   (D) a hindered amine-type light stabilizer.

8. The solar cell encapsulant of claim 7, wherein the component (D) is present in the resin composition in an amount of 0.01 to 2.5 parts by weight, relative to 100 parts by weight of the component (A).

9. The solar cell encapsulant of claim 1, wherein the component (A) is an ethylene.propylene copolymer, an ethylene.1-butene copolymer, or an ethylene.1-hexene copolymer.

10. The solar cell encapsulant of claim 1, wherein the component (A) is an ethylene.propylene.1-hexene terpolymer.

11. The solar cell encapsulant of claim 1, wherein the solar cell encapsulant is in the form of a sheet.

12. The solar cell encapsulant of claim 1, wherein (a1) the density is from 0.870 to 0.915 g/cm$^3$.

13. The solar cell encapsulant of claim 1, wherein (a1) the density is from 0.875 to 0.910 g/cm$^3$.

14. The solar cell encapsulant of claim 1, wherein (a2) the ratio, (Mz/Mn), is from 2.5 to 5.0.

15. The solar cell encapsulant of claim 1, wherein (a2) the ratio, (Mz/Mn), is from 3.0 to 4.0.

16. The solar cell encapsulant of claim 1, wherein (a3) the melt viscosity ($\eta^*_1$) measured at 100° C., under the shear rate of 2.43×10 sec$^{-1}$, is from 1.3×10$^5$ poise to 9.0×10$^5$ poise.

17. The solar cell encapsulant of claim 1, wherein (a4) the melt viscosity ($\eta^*_2$) measured at 100° C., under the shear rate of 2.43×10$^2$ sec$^{-1}$, is from 2.1×10$^4$ poise to 9.0×10$^4$ poise.

18. A solar cell module, comprising the solar cell encapsulant of claim 11.

19. A solar cell encapsulant consisting essentially of:
   an ethylene.α-olefin copolymer;
   at least one of an organic peroxide and a silane coupling agent; and
   optionally one or more additives selected from the group consisting of a hindered amine-type light stabilizer, a cross-linking auxiliary agent, an ultraviolet absorbing agent, an antioxidant, a crystallization nucleating agent, a transparency enhancing agent, a lubricant, a coloring agent, a dispersing agent, a filler, a fluorescent whitening agent, and a light stabilizer;
   wherein the ethylene.α-olefin copolymer satisfies (a1) to (a4) and at least one of (a5) and (a6):
   (a1) a density of 0.860 to 0.920 g/cm$^3$,
   (a2) a ratio, (Mz/Mn), of Z average molecular weight (Mz) and number average molecular weight (Mn) determined by a gel permeation chromatography (GPC), of 8.0 or less,
   (a3) a melt viscosity ($\eta^*_1$) measured at 100° C. under a shear rate of 2.43×10 s$^{-1}$ of 1.2×10$^5$ poise or more,
   (a4) a melt viscosity ($\eta^*_2$) measured at 100° C. under a shear rate of 2.43×10$^2$s$^{-1}$ of 2.0×10$^4$ poise or more,
   (a5) a branch number (N) derived from a comonomer in a polymer that satisfies expression (a):

$N \geq -0.67 \times E + 53$        (a), wherein N represents the branch number per total 1000 carbon atoms in a main chain and a side chain, measured by NMR, and E represents a modulus of elasticity in tension of a sheet, measured in accordance with ISO1184-1983, and (a6) a flow ratio (FR) ($I_{10}/I_{2.16}$) of $I_{10}$ which is an MFR measured value at 190° C. under a load of 10 kg, and $I_{2.16}$ which is an MFR measured value at 190° C. under a load of 2.16 kg, of below 7.0.

20. The solar cell encapsulant according to claim 19 consisting of:
    the ethylene.α-olefin copolymer;
    at least one of the organic peroxide and the silane coupling agent; and
    optionally one or more additives selected from the group consisting of a hindered amine-type light stabilizer, a cross-linking auxiliary agent, an ultraviolet absorbing agent, an antioxidant, a crystallization nucleating agent, a transparency enhancing agent, a lubricant, a coloring agent, a dispersing agent, a filler, a fluorescent whitening agent, and a light stabilizer.

21. A solar cell encapsulant comprising at least one sheet consisting essentially of:
    an ethylene.α-olefin copolymer;
    at least one of an organic peroxide and a silane coupling agent; and
    optionally one or more additives selected from the group consisting of a hindered amine-type light stabilizer, a cross-linking auxiliary agent, an ultraviolet absorbing agent, an antioxidant, a crystallization nucleating agent, a transparency enhancing agent, a lubricant, a coloring agent, a dispersing agent, a filler, a fluorescent whitening agent, and a light stabilizer;
    wherein the ethylene.α-olefin copolymer satisfies (a1) to (a4) and at least one of (a5) and (a6):
    (a1) a density of 0.860 to 0.920 g/cm³,
    (a2) a ratio, (Mz/Mn), of Z average molecular weight (Mz) and number average molecular weight (Mn) determined by a gel permeation chromatography (GPC), of 8.0 or less,
    (a3) a melt viscosity ($\eta_1$) measured at 100° C. under a shear rate of $2.43 \times 10$ s$^{-1}$ of $1.2 \times 10^5$ poise or more,
    (a4) a melt viscosity ($\eta_2$) measured at 100° C. under a shear rate of $2.43 \times 10^2$ s$^{-1}$ of $2.0 \times 10^4$ poise or more,
    (a5) a branch number (N) derived from a comonomer in a polymer that satisfies expression (a):

$$N \geq -0.67 \times E + 53 \qquad \text{(a)},$$

wherein N represents the branch number per total 1000 carbon atoms in a main chain and a side chain, measured by NMR, and E represents a modulus of elasticity in tension of a sheet, measured in accordance with ISO1184-1983, and
    (a6) a flow ratio (FR) ($I_{10}/I_{2.16}$) of $I_{10}$ which is an MFR measured value at 190° C. under a load of 10 kg, and $I_{2.16}$ which is an MFR measured value at 190° C. under a load of 2.16 kg, of below 7.0.

22. The solar cell encapsulant according to claim 21, wherein the sheet consists of:
    the ethylene.α-olefin copolymer;
    at least one of the organic peroxide and the silane coupling agent; and
    optionally one or more additives selected from the group consisting of a hindered amine-type light stabilizer, a cross-linking auxiliary agent, an ultraviolet absorbing agent, an antioxidant, a crystallization nucleating agent, a transparency enhancing agent, a lubricant, a coloring agent, a dispersing agent, a filler, a fluorescent whitening agent, and a light stabilizer.

* * * * *